United States Patent
Lee et al.

(10) Patent No.: US 7,542,328 B2
(45) Date of Patent: Jun. 2, 2009

(54) METHOD OF DETECTING BIT LINE BRIDGE BY SELECTIVELY FLOATING EVEN-OR ODD-NUMBERED BIT LINES OF MEMORY DEVICE

(75) Inventors: Jung-Hwa Lee, Gyeonggi-do (KR); Ji-Hyun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 11/777,627

(22) Filed: Jul. 13, 2007

(65) Prior Publication Data

US 2008/0062787 A1    Mar. 13, 2008

(30) Foreign Application Priority Data

Jul. 14, 2006    (KR) .................... 10-2006-0066272

(51) Int. Cl.
  *G11C 11/24* (2006.01)
(52) U.S. Cl. ...................... 365/149; 365/201
(58) Field of Classification Search ............. 365/149, 365/207, 201
  See application file for complete search history.

(56) References Cited

U.S. PATENT DOCUMENTS 5,886,939 A * 3/1999 Choi et al. ............ 365/210.15
6,396,754 B1 * 5/2002 Lee et al. .................... 365/201
7,257,013 B2 * 8/2007 Roehr ......................... 365/148
7,474,573 B2 * 1/2009 Shin ............................. 365/201

FOREIGN PATENT DOCUMENTS

| JP | 2004-039124 | 2/2004 |
|---|---|---|
| KR | 2002-0011213 | 2/2002 |
| KR | 2002-0064638 | 8/2002 |

OTHER PUBLICATIONS

English language abstract of Korean Publication No. 2002-0011213.
English language abstract of Korean Publication No. 2002-0064638.
English language abstract of Japanese Publication No. 2004-039124.

* cited by examiner

*Primary Examiner*—Anh Phung
(74) *Attorney, Agent, or Firm*—Marger Johnson & McCollom, P.C.

(57) ABSTRACT

Provided is a bit line bridge detection method for selectively floating even-numbered or odd-numbered bit lines. The bit line bridge detection method simultaneously activates even-numbered sense amplifiers and odd-numbered sense amplifiers in response to a sense amplifier enable signal. The even-numbered sense amplifiers and the odd-numbered sense amplifiers are selectively disabled in response to a sense amplifier disable signal generated at a predetermined time after the sense amplifier enable signal is generated, and an even-numbered or odd-numbered sense amplifier selection signal which is stored in a mode register. As a result, the even-numbered bit lines and the odd-numbered bit lines are selectively floated. If data input to memory cells is inverted, a bit line bridge is detected.

21 Claims, 3 Drawing Sheets

US 7,542,328 B2

METHOD OF DETECTING BIT LINE BRIDGE BY SELECTIVELY FLOATING EVEN-OR ODD-NUMBERED BIT LINES OF MEMORY DEVICE

CROSS-REFERENCE TO RELATED PATENT APPLICATION

This application claims the benefit of Korean Patent Application No. 10-2006-0066272, filed on Jul. 14, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a method of detecting a bit line bridge by selectively floating even- or odd-numbered bit lines.

2. Description of the Related Art

As the integration density of DRAMs is improved, the probability of defects, such as a bit line bridge between memory cells (for example, C1 and C2 illustrated in FIG. 1) increases. The bit line bridge is a phenomenon where a low resistance occurs between adjacent bit lines due to particles or other defects. The low resistance of the bit line bridge occurs when a leakage current flows between adjacent bit lines causing a margin deficiency during a charge-sharing operation of the bit lines and resulting in a device defect.

Conventionally, a bit line bridge is detected by forcing an increase in the current leakage time and increasing the bit line leakage current. However, with this conventional method, when the resistance of the bit line bridge is great, it is difficult to increase the voltage difference between the bit lines since increasing the current leakage time cannot significantly increase the bit line leakage current. Further, although a large voltage difference between bit lines aids the detection of bit line bridges, the high voltage between bit lines can cause unwanted voltage stress.

SUMMARY

The present invention provides a method of detecting a bit line bridge by selectively floating even-numbered or odd-numbered bit lines.

According to an embodiment of the present invention, a method for detecting a bit line bridge of a memory device includes enabling a word line and activating a sense amplifier enable signal in response to an active command. The method also includes activating a first supply voltage signal and a first ground signal for driving a plurality of odd-numbered sense amplifiers connected to a plurality of odd-numbered bit lines, and a second supply voltage signal and a second ground signal for driving a plurality of even-numbered sense amplifiers connected to a plurality of even-numbered bit lines, in response to the sense amplifier enable signal. A sense amplifier disable signal is then activated at a predetermined time after the sense amplifier enable signal is activated. As a result, either the second supply voltage signal and the second ground signal are deactivated in response to the sense amplifier disable signal and the even-numbered sense amplifier selection signal, or the first supply voltage signal and the first ground signal are deactivated in response to the sense amplifier disable signal and the odd-numbered sense amplifier selection signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
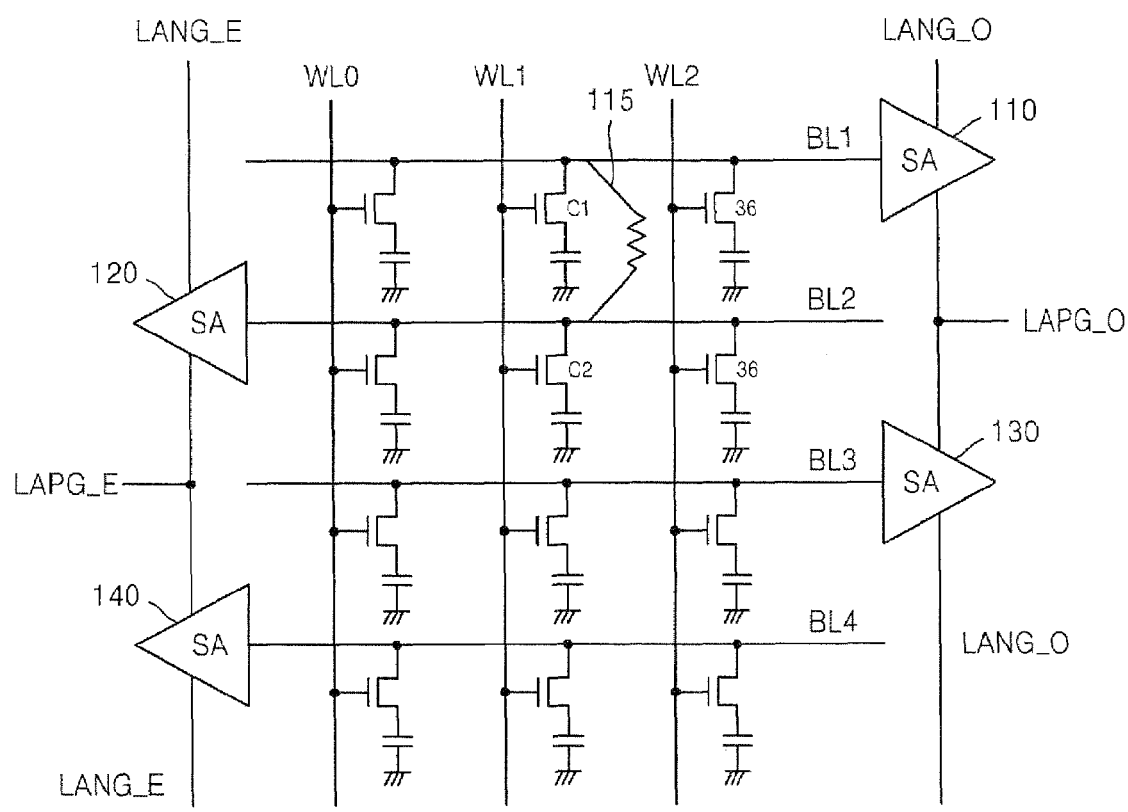
FIG. 1 is a view illustrating a bit line bridge between adjacent cells in a DRAM.

The attached drawings for illustrating embodiments of the present invention are referred to in order to gain a sufficient understanding of the present invention, the merits thereof, and the objectives accomplished by the implementation of the present invention.

Hereinafter, the present invention will be described in detail by explaining exemplary embodiments of the invention with reference to the attached drawings. Like reference numerals in the drawings denote like elements.

FIG. 1 is a view illustrating a memory device for detecting a bit line bridge between adjacent cells. Referring to FIG. 1, a plurality of memory cells C1 and C2 are arranged at the intersections of a plurality of word lines WL0, WL1, and WL2 and a plurality of bit lines BL1, BL2, BL3, and BL4. The first and third bit lines BL1 and BL3 are respectively connected to first and third sense amplifiers 110 and 130, and the second and fourth bit lines BL2 and BL4 are respectively connected to second and fourth sense amplifiers 120 and 140. That is, the odd-numbered bit lines BL1 and BL3 are connected to the odd-numbered sense amplifiers 110 and 130, which are located on the right side of the memory cell array. Data passing through the odd-numbered bit lines BL1 and BL3 is sensed and amplified by the odd-numbered sense amplifiers 110 and 130. The even-numbered bit lines BL2 and BL4 are connected to the even-numbered sense amplifiers 120 and 140, which are located on the left side of the memory cell array. Data passing through the even-numbered bit lines BL2 and BL4 is sensed and amplified by the even-numbered sense amplifiers 120 and 140.

When a bit line bridge 115 occurs between the memory cells C1 and C2 connected to the word line WL1, for example, both the bit lines BL1 and BL2 can be connected. Accordingly, a method for selectively enabling the odd-numbered sense amplifiers 110 and 130 or the even-numbered sense amplifiers 120 and 140 and disabling the rest can be considered to detect whether the bit lines BL1 and BL2 are connected or floated.

The odd-numbered sense amplifiers 110 and 130 are driven by a first supply voltage signal LAPG_O and a first ground signal LANG_O, and the even-numbered sense amplifiers 120 and 140 are driven by a second supply voltage signal LAPG_E and a second ground signal LANG_E.

Figure 2:
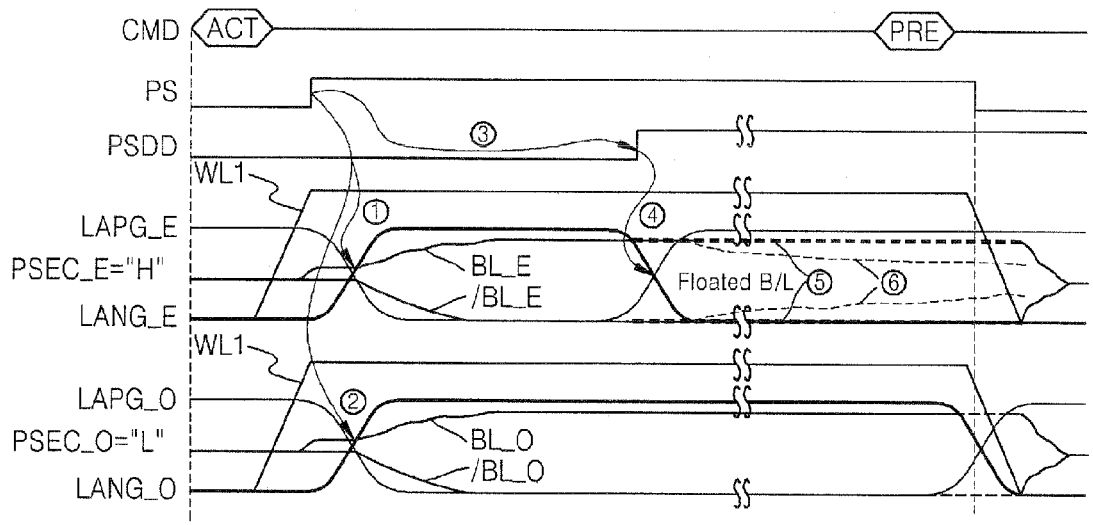
FIG. 2 is a timing diagram illustrating a bit line bridge detection method according to an embodiment of the present invention.

FIG. 2 is a timing diagram illustrating a bit line bridge detection method according to an embodiment of the present invention. Initially, an even-numbered sense amplifier selection signal PSEC_E and an odd-numbered amplifier selection signal PSEC_O are stored in a mode register. In the current embodiment, it is assumed that the even-numbered sense amplifier selection signal PSEC_E is "high" and the odd-numbered sense amplifier selection signal PSEC_O is "low". Referring to FIGS. 1 and 2, a selected word line WL1 is enabled and a sense amplifier enable signal PS is activated in response to an active command ACT. The enabled word line WL1 causes the even-numbered bit lines BL_E and the odd-numbered bit lines BL_O to be charge-shared.

In response to the activated sense amplifier enable signal PS, the second supply voltage signal LAPG_E and the second ground signal LANG_E are activated. Accordingly, the even-numbered sense amplifiers 120 and 140 sense-amplify data of the even-numbered bit lines BL_E, so as to develop a voltage of the even-numbered bit lines BL_E (①). Also, in response to the sense amplifier enable signal PS, the first supply voltage signal LAPG_O and the first ground signal LANG_O are activated. Accordingly, the odd-numbered sense amplifiers 110 and 130 sense and amplify data of the odd-numbered bit lines BL_O, so as to develop a voltage of the odd-numbered bit lines BL_O (②).

In a predetermined time after the sense amplifier enable signal PS is activated, a sense amplifier disable signal PSDD is activated (③). In response to the even-numbered sense amplifier selection signal PSEC_E, which is "high", the second supply voltage signal LAPG_E and the second ground signal LANG_E are deactivated so that the even-numbered sense amplifiers 120 and 140 are disabled (④). Accordingly, the even-numbered bit lines BL_O or BL_E are floated. At this time, the odd-numbered sense amplifiers 110 and 130 stay enabled since the first supply voltage signal LAPG_O and the second first signal LANG_O remain activated by the odd-numbered sense amplifier selection signal PSEC_O which is "low".

If there is no bit line bridge between the adjacent bit lines BL_O, the floated even-numbered bit lines BL_E stay at their current voltage (⑤). If there is a bit line bridge between the adjacent odd-numbered bit lines BL_O, the voltage of the floated even-numbered bit lines BL_E is changed by the influence of the voltage of the adjacent odd-numbered bit lines BL_O (⑥). The change in the voltage of the floated even-numbered bit lines BL_E inverts data input to the memory cells connected to the floated even-numbered bit lines BL_E. Thereafter, a precharge command PRE is received, disabling the selected word line WL1.

By screening memory cell data after applying the bit line bridge detection method according to the current embodiment, any memory cell containing inverted data is detected. A bit line bridge is found between the bit line of that memory cell and an adjacent bit line.

Accordingly, the bit line bridge detection method illustrated in FIG. 2 detects the bit line bridge by selectively disabling the even-numbered sense amplifiers 120 and 140 and the odd-numbered sense amplifiers 110 and 130, using the sense amplifier disable signal PSDD automatically generated a predetermined time after the sense amplifier enable signal PS is generated in response to the active command ACT, and the even-numbered sense amplifier selection signal PSEC_E and the odd-numbered sense amplifier selection signal PSEC_O stored in the mode register.

Figure 3:
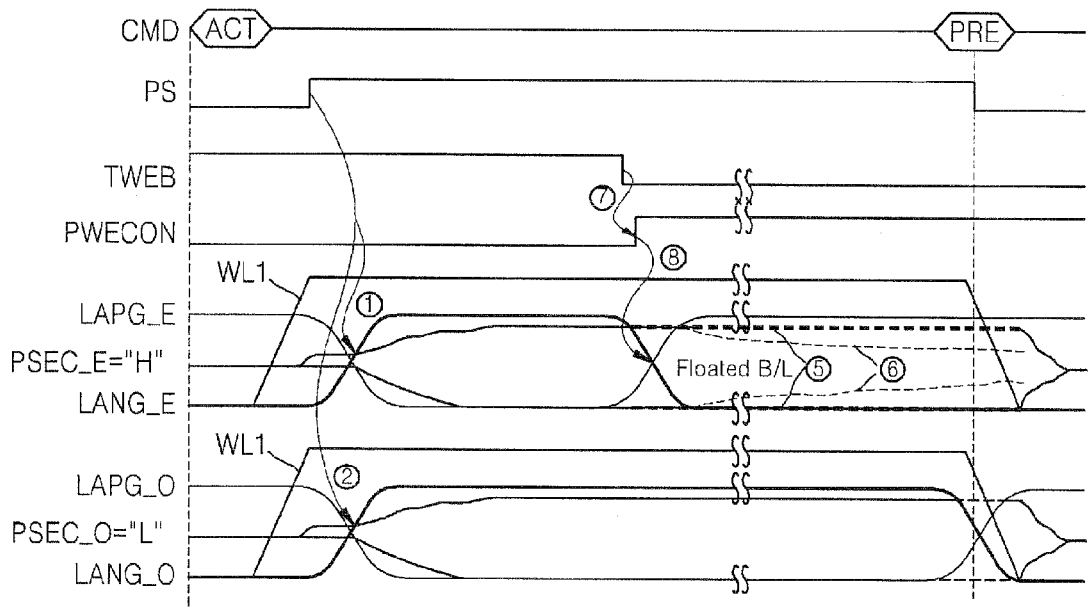
FIG. 3 is a timing diagram illustrating a bit line bridge detection method according to another embodiment of the present invention.

FIG. 3 is a timing diagram illustrating a bit line bridge detection method according to another embodiment of the present invention. Referring to FIGS. 1 and 3, the second supply voltage signal LAPG_E and the second ground signal LANG_E of the even-numbered sense amplifiers 120 and 140, and the first supply voltage signal LAPG_O and the first ground signal LANG_O of the odd-numbered sense amplifiers 110 and 130 are controlled by a bridge detection signal TWEB which indicates detection of a bit line bridge and is received from the outside. The bridge detection signal TWEB activates a sense amplifier control signal PWECON, which is described later with reference to FIG. 4 (⑦). The sense amplifier control signal PWECON is similar to the sense amplifier disable signal PSDD illustrated in FIG. 2.

Figure 4:
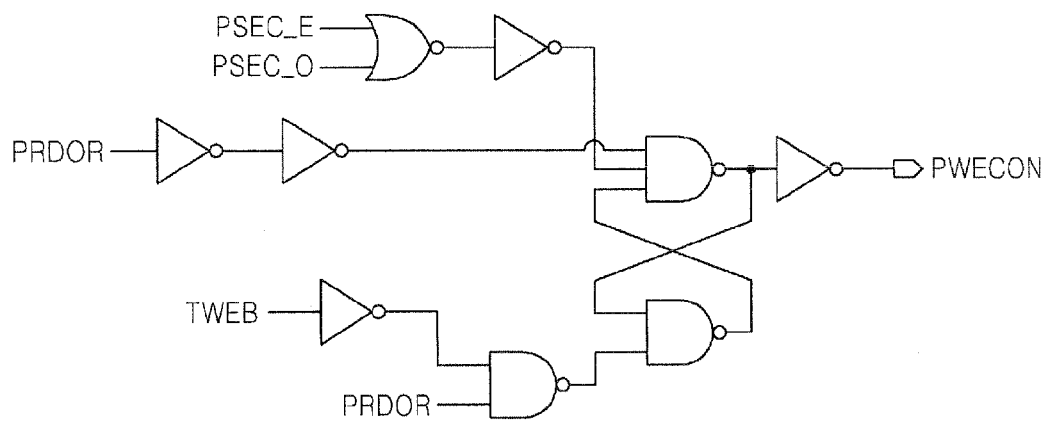
FIG. 4 is a circuit diagram of a circuit for generating a sense amplifier control signal according to an embodiment of the present invention.
Figure 6:
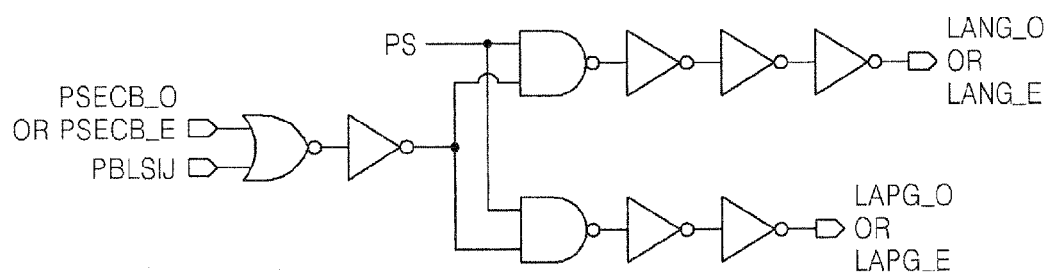
FIG. 6 is a circuit diagram of a circuit for generating a first supply voltage signal, a second supply voltage signal, a first ground signal, and a second ground signal according to an embodiment of the present invention.

The sense amplifier control signal PWECON is generated by the circuits illustrated in FIGS. 4 and 6. FIG. 4 is a circuit diagram of a circuit for generating the sense amplifier control signal PWCON. Referring to FIG. 4, the sense amplifier control signal PWECON is generated in response to a mode indication signal PRDOR indicating an active mode or a precharge mode of the memory device, the bridge detection signal TWEB, and the even-numbered sense amplifier selection signal PSEC-E and the odd-numbered amplifier selection signal PSEC_O stored in the mode register.

The mode indication signal PRDOR is "high" in the active mode and "low" in the precharge mode. The bridge detection signal TWEB is applied with a logic "low" level when a bit line bridge is detected. The even-numbered sense amplifier selection signal PSEC_E and the odd-numbered sense amplifier selection signal PSEC_O are stored with different logic levels in the mode register. The sense amplifier control signal PWECON is generated with a "high" level in response to the mode indication signal PRDOR which is "low", the bridge detection signal TWEB which is "high", the even-numbered sense amplifier selection signal PSEC_E, and the odd-numbered sense amplifier selection signal PSEC_O.

Figure 5:
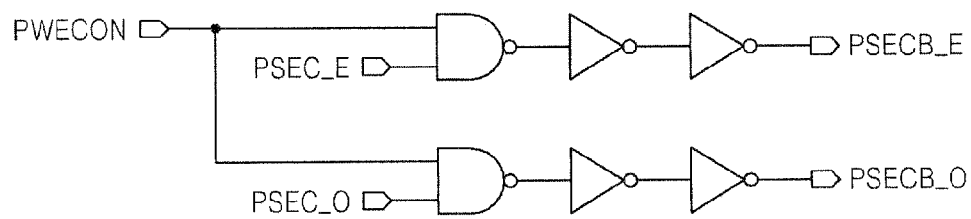
FIG. 5 is a circuit diagram of a circuit for generating an even-numbered sense amplifier control signal and an odd-numbered sense amplifier control signal according to an embodiment of the present invention.

FIG. 5 is a circuit diagram of a circuit for generating an even-numbered sense amplifier control signal PSECB_E and an odd-numbered sense amplifier control signal PSECB_O. Referring to FIG. 5, the even-numbered sense amplifier control signal PSECB_E and the odd-numbered sense amplifier control signal PSECB_O are generated in response to the sense amplifier control signal PWECON, the even-numbered sense amplifier selection signal PSEC_E, and the odd-numbered sense amplifier selection signal PSEC_O. While the sense amplifier control signal PWECON is "high", the even-numbered sense amplifier selection signal PSECB_E becomes "low" when the even-numbered sense amplifier selection signal PSEC_E becomes "high", and the odd-numbered sense amplifier control signal PSECB_O becomes "high" when the odd-numbered sense amplifier selection signal PSEC_O becomes "low".

FIG. 6 is a circuit diagram of a circuit for generating the first and second supply voltage signals LAPG_O and LAPG_E and the first and second ground signals LANG_O and LANG_E. Referring to FIG. 6, the first supply voltage signal LAPG_O and the second ground signal LANG_O are generated in response to the odd-numbered sense amplifier control signal PSECB_O, a memory block selection signal PBLSIJ, and the sense amplifier enable signal PS. The memory block selection signal PBLSIJ selects a memory cell for which to detect a bit line bridge.

In response to the memory block selection signal PBLSIJ that is "high", the sense amplifier enable signal PS, and the odd-numbered sense amplifier control signal PSECB_O, the first supply voltage signal LAPG_O becomes "low" and the first ground signal LANG_O becomes "high". Also, in response to the memory block selection signal PBLSIJ that is "high", the sense amplifier enable signal PS, and the even-numbered sense amplifier control signal PSECB_E which is "low", the second supply voltage signal LAPG_E becomes "high" and the second ground signal LANG_E becomes "low".

Returning to FIG. 3, in response to the active command ACT, the selected word line WL1 is enabled and the sense amplifier enable signal PS is activated. The even-numbered bit lines BL_E and the odd-numbered bit lines BL_O are charge-shared by the enabled word line WL1.

The second supply voltage signal LAPG_E and the second ground signal LANG_E are activated in response to the activated sense amplifier enable signal PS (①). Accordingly, the even-numbered sense amplifiers 120 and 140 sense and amplify data of the even-numbered bit lines BL_E, so as to develop a voltage of the even-numbered bit lines BL_E. Also, the first supply voltage signal LAPG_O and the first ground signal LANG_O are activated in response to the sense amplifier enable signal PS (②). Accordingly, the odd-numbered sense amplifiers 110 and 130 sense and amplify data of the odd-numbered bit lines BL_O, so as to develop a voltage of the odd-numbered bit lines BL_O.

If a bridge detection signal TWEB, which is activated to "low" is received from the outside, the sense amplifier control signal PWECON is activated to "high" (⑦). The second supply voltage signal LAPG_E and the second ground signal LANG_E are deactivated, in response to the sense amplifier control signal PWECON which is "high" and the even-numbered sense amplifier selection signal PSEC_E which is "high", so that the even-numbered sense amplifiers 120 and 140 are disabled (④). Accordingly, the even-numbered bit lines BL_E are floated. At this time, the odd-numbered sense amplifiers 110 and 130 stay enabled since the first supply voltage signal LAPG_O and the second ground signal LANG_O are kept activated by the sense amplifier control signal PWECON which is "high" and the odd-numbered sense amplifier selection signal PSEC_O which is "low".

The floated even-numbered bit lines BL_E are maintained at their current voltage if there is no bit line bridge between the adjacent odd-numbered bit lines BL_O (⑤). If there is a bit line bridge between the adjacent odd-numbered bit lines BL_O, the voltage of the floated even-numbered bit lines BL_E changes depending on the voltage of the adjacent odd-numbered bit lines BL_O (⑥). The change in voltage of the even-numbered bit lines BL_E inverts data input to memory cells connected to the floated even-numbered bit lines BL_E. Then, a precharge command PRE is input and a selected word line WL1 is disabled.

By screening memory cell data after applying the bit line bridge detection method according to the current embodiment, a memory cell containing inverted data is detected. A bit line bridge is found between the bit line of that memory cell and an adjacent bit line.

The bit line bridge detection method illustrated in FIG. 3 generates a bit line detection signal TWEB from the outside of the memory device according to a user's intention, and selectively disables even-numbered sense amplifiers 120 and 140 and odd-numbered sense amplifiers 110 and 130, in response to a sense amplifier control signal PWECON generated according to the bit line detection signal TWEB, an even-numbered sense amplifier selection signal PSEC_E, and an odd-numbered sense amplifier selection signal PSEC_O which are stored in a mode register, thereby detecting a bit line bridge phenomenon.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method for detecting a bit line bridge of a memory device, comprising:
   enabling a word line and activating a sense amplifier enable signal in response to an active command;
   storing an even-numbered sense amplifier selection signal and an odd-numbered amplifier selection signal;
   activating a first supply voltage signal and a first ground signal for driving a plurality of odd-numbered sense amplifiers connected to a plurality of odd-numbered bit lines, and a second supply voltage signal and a second ground signal for driving a plurality of even-numbered sense amplifiers connected to a plurality of even-numbered bit lines, in response to the sense amplifier enable signal;
   activating a sense amplifier disable signal after a predetermined time has passed since the activation of the sense amplifier enable signal;
   deactivating the second supply voltage signal and the second ground signal, in response to the sense amplifier disable signal and the even-numbered sense amplifier selection signal, or deactivating the first supply voltage signal and the first ground signal, in response to the sense amplifier disable signal and the odd-numbered sense amplifier selection signal; and
   screening memory cell data between the even and odd bit lines.

2. The method of claim 1, wherein the even-numbered sense amplifier selection signal and the odd-numbered sense amplifier selection signal are alternately stored in an activated state.

3. The method of claim 1, wherein the even-numbered sense amplifier selection signal and the odd-numbered sense amplifier selection signal are stored in a mode register of the memory device.

4. The method of claim 1, further comprising charge-sharing the even-numbered bit lines and the odd-numbered bit lines by the enabled word line.

5. The method of claim 1, further comprising sense-amplifying data of the odd-numbered bit lines using the odd-numbered sense amplifiers, in response to activation of the first supply voltage signal and the first ground signal, thus developing a voltage in the odd-numbered bit lines.

6. The method of claim 1, further comprising sense-amplifying data of the even-numbered bit lines using the even-numbered sense amplifiers, in response to activation of the second supply voltage signal and the second ground signal, thus developing a voltage in the even-numbered bit lines.

7. The method of claim 1, wherein the odd-numbered bit lines are floated by the odd-numbered sense amplifiers that are disabled when the first supply voltage signal and the first ground signal are deactivated.

8. The method of claim 1, wherein the even-numbered bit lines are floated by the even-numbered sense amplifiers that are disabled when the second supply voltage signal and the second ground signal are deactivated.

9. The method of claim 1, further comprising disabling the word line by a precharge command.

10. The method of claim 1, wherein screening memory cell data between the even and odd bit lines for memory cells containing inverted data includes performing a read operation between a bit line and an adjacent bit line for detecting a memory cell with inverted data to determine whether a bit line bridge exists.

11. A method for detecting a bit line bridge of a memory device, comprising:
    enabling a word line and activating a sense amplifier enable signal, in response to an active command;
    storing an even-numbered sense amplifier selection signal and an odd-numbered amplifier selection signal;
    activating a first supply voltage signal and a first ground signal for driving a plurality of odd-numbered sense amplifiers connected to a plurality of odd-numbered bit lines, and a second supply voltage signal and a second ground signal for driving a plurality of even-numbered sense amplifiers connected to a plurality of even-numbered bit lines, in response to the sense amplifier enable signal;
    generating a sense amplifier control signal in response to a bridge detection signal received from outside of the memory device;
    deactivating the second supply voltage signal and the second ground signal, in response to the sense amplifier control signal and the even-numbered sense amplifier selection signal, or deactivating the first supply voltage signal and the first ground signal, in response to the sense amplifier control signal and the odd-numbered sense amplifier selection signal; and
    screening memory cell data between the even and odd bit lines.

12. The method of claim 11, wherein the even-numbered sense amplifier selection signal and the odd-numbered sense amplifier selection signal are alternately stored in an activated state.

13. The method of claim 11, wherein the even-numbered sense amplifier selection signal and the odd-numbered sense amplifier selection signal are stored in a mode register of the memory device.

14. The method of claim 11, further comprising charge-sharing the even-numbered bit lines and the odd-numbered bit lines by the enabled word line.

15. The method of claim 11, further comprising sensing-amplifying data of the odd-numbered bit lines using the odd-numbered sense amplifiers, in response to activation of the first supply voltage signal and the first ground signal, thus developing a voltage in the odd-numbered bit lines.

16. The method of claim 11, further comprising sense-amplifying data of the even-numbered bit lines using the even-numbered sense amplifiers, in response to activation of the second supply voltage signal and the second ground signal, thus developing a voltage in the even-numbered bit lines.

17. The method of claim 11, wherein the odd-numbered bit lines are floated by the odd-numbered sense amplifiers that are disabled when the first supply voltage signal and the first ground signal are deactivated.

18. The method of claim 11, wherein the even-numbered bit lines are floated by the even-numbered sense amplifiers that are disabled when the second supply voltage signal and the second ground signal are deactivated.

19. The method of claim 11, wherein the word line is disabled by a precharge command.

20. The method of claim 11, wherein screening memory cell data between the even and odd bit lines for memory cells containing inverted data includes performing a read operation between a bit line and an adjacent bit line for detecting a memory cell with inverted data to determine whether a bit line bridge phenomenon exists.

21. The method of claim 11, wherein sense amplifier control signal is generated in response to both the bridge detection signal and a mode indication signal, the mode indication signal indicating an active mode or a precharge mode.

* * * * *

UNITED STATES PATENT AND TRADEMARK OFFICE
CERTIFICATE OF CORRECTION

| | |
|---|---|
| PATENT NO. | : 7,542,328 B2 |
| APPLICATION NO. | : 11/777627 |
| DATED | : June 2, 2009 |
| INVENTOR(S) | : Jung-Hwa Lee et al. |

It is certified that error appears in the above-identified patent and that said Letters Patent is hereby corrected as shown below:

On the title page, item [54] and column 1, line 2:
The Title "METHOD OF DETECTING BIT LINE BRIDGE BY SELECTIVELY FLOATING EVEN-OR ODD-NUMBERED BIT LINES OF MEMORY DEVICE" should read -- METHOD OF DETECTING BIT LINE BRIDGE BY SELECTIVELY FLOATING EVEN- OR ODD-NUMBERED BIT LINES OF MEMORY DEVICE --.

Signed and Sealed this

Twenty-second Day of September, 2009

David J. Kappos
*Director of the United States Patent and Trademark Office*